United States Patent
Tsubone

(10) Patent No.: US 7,417,208 B2
(45) Date of Patent: Aug. 26, 2008

(54) POWER SUPPLY DEVICE

(75) Inventor: Kenji Tsubone, Susono (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 427 days.

(21) Appl. No.: 11/304,700

(22) Filed: Dec. 16, 2005

(65) Prior Publication Data
US 2006/0132100 A1 Jun. 22, 2006

(30) Foreign Application Priority Data
Dec. 22, 2004 (JP) ............................ P2004-371935

(51) Int. Cl.
*H05B 1/02* (2006.01)
(52) U.S. Cl. .................. 219/497; 219/508; 219/202; 219/206; 219/494; 123/179.1
(58) Field of Classification Search .............. 219/497, 219/494, 501, 507, 508, 202–206; 307/38–41; 123/179.1, 406.55
See application file for complete search history.

(56) References Cited

U.S. PATENT DOCUMENTS

| | | | |
|---|---|---|---|
| 3,885,126 A * | 5/1975 | Sugiyama et al. | ............ 392/485 |
| 4,148,192 A | 4/1979 | Cummings et al. | |
| 2006/0121325 A1 * | 6/2006 | Beguery et al. | ................ 429/23 |
| 2008/0041082 A1 * | 2/2008 | Bilodeau | ..................... 62/230 |

FOREIGN PATENT DOCUMENTS

| | | |
|---|---|---|
| DE | 196 39 713 C1 | 4/1998 |
| JP | 08-079915 | 3/1996 |
| JP | 2004-050873 | 2/2004 |

OTHER PUBLICATIONS

EPO Search Report dated Mar. 28, 2006.
Patent Abstracts of Japan, vol. 2000, No. 16, May 8, 2001 & JP 2001 028805, Jan. 30, 2001.

* cited by examiner

*Primary Examiner*—Mark H Paschall
(74) *Attorney, Agent, or Firm*—Finnegan, Henderson, Farabow, Garrett & Dunner, LLP.

(57) ABSTRACT

The power supply device comprises first wiring that connects an alternator that is driven by the engine and a constant voltage electrical load that is driven at 12V, a heat accumulator that accumulates cooling heat and warming heat, a thermoelectric converter which generates power by using the heat that has accumulated in the heat accumulator and which supplies the generated power to the battery, second wiring that connects the battery and a variable voltage electrical load that is driven at 5V to 16V, for example, a relay which is provided on third wiring that connects the first wiring and second wiring and which interrupts the first wiring and second wiring, and a charge and discharge ECU which controls the thermoelectric converter on the basis of travel route information and so forth and which controls the relay on the basis of the operating state of the engine, the heat accumulation state of the heat accumulator, and the state of charge of the battery.

7 Claims, 8 Drawing Sheets

POWER SUPPLY DEVICE

BACKGROUND OF THE INVENTION

1. Field of the Invention

The present invention relates to a power supply device and, more particularly, to a vehicle power supply device.

2. Related Background of the Invention

Conventionally, an alternator (AC power generator), which generates an AC current as a result of being driven by the motive power of the engine, is used to supply electrical power to a variety of electrical components mounted in a vehicle (Japanese Patent Application Laid Open No. H8-79915). The alternator rectifies the generated AC current by means of a diode to convert the AC current to a DC current, supplies the DC current to each electrical component and charges the battery.

SUMMARY OF THE INVENTION

The electrical load of each of the electrical components to which power is supplied from the alternator fluctuates as a result of the operating state and so forth of the vehicle. Hence, the load required to drive the alternator also fluctuates. For example, when the drive load of the alternator increases, the drive force supplied to each wheel of the engine drive force decreases and drivability deteriorates. Moreover, when the driver, in sensing a lack of drive force, then steps on the accelerator pedal in order to compensate for the lack of drive force, fuel consumption deteriorates.

The present invention was conceived in view of solving the above problems and an object of the present invention is to provide a power supply device that makes it possible to suppress a deterioration in drivability and improve fuel consumption.

The power supply device according to the present invention comprises first wiring that connects a power generator that is driven by an internal combustion engine and a constant voltage electrical load that is driven at a predetermined voltage; a heat accumulator that accumulates cooling heat and warming heat; a thermoelectric converter that generates power by using the heat accumulated in the heat accumulator and which supplies the generated power to the battery; second wiring that connects the battery and a variable voltage electrical load that is driven in a predetermined voltage range; interrupting means provided on third wiring that connects the first wiring and the second wiring, which interrupts the first wiring and the second wiring; and controlling means that controls the thermoelectric converter and also controls the interrupting means on the basis of the operating state of the internal combustion engine, the heat accumulation state of the heat accumulator, and the state of charge of the battery.

According to the power supply device of the present invention, electrical loads mounted on the vehicle are divided into a constant voltage electrical load that is driven by a predetermined voltage (12V, for example) and a variable voltage electrical load that is driven by a range of predetermined voltages (5V to 16V, for example). The power generator and constant voltage electrical load are connected by means of first wiring, the battery and variable voltage electrical load are connected by means of second wiring, and the first wiring and second wiring are connected via interrupting means. The interrupting means is controlled on the basis of the operating state of the internal combustion engine, accumulation state of a heat accumulator, and recharging state of the battery and, when the first wiring and second wiring are broken, the power outputted by the power generator is supplied to only the constant voltage electrical load. Therefore, the electrical load is diminished and the drive load fluctuations of the power generator decrease.

On the other hand, when the battery is charged by the power generator, the first wiring and second wiring are connected and the power that is outputted from the power generator is supplied to the battery and variable voltage electrical load. Here, the drive judgment of the interrupting means is performed in accordance with the operating state of the internal combustion engine that drives the power generator. Therefore, recharging in an operating area that causes a deterioration of the drivability can be prevented. Furthermore, according to this power supply device, the variable voltage electrical load is driven by means of a low voltage that is equal to or less than a predetermined voltage and the battery is able to receive a supply of power from a thermoelectric converter. As a result, the control voltage range of the recharging/discharging control increases and the freedom of control of the interrupting means can be increased. As a result, load fluctuations of the internal combustion engine are suppressed and, therefore, deterioration of the drivability can be suppressed.

The controlling means preferably controls the thermoelectric converter in accordance with the heat amount that has accumulated in the heat accumulator and the battery charge amount required to start the internal combustion engine.

In this case, the usable surplus heat amount can be determined by comparing the heat amount accumulated in the heat accumulator and the heat amount required in order to charge the battery to the battery charge amount that allows the internal combustion engine to start. As a result, power can be supplied to the battery from the thermoelectric converter by effectively using the heat mount that has accumulated in the heat accumulator while securing the starting characteristic of the internal combustion engine.

Further, the controlling means preferably allows the thermoelectric converter to operate when an ignition switch of a vehicle is turned off and preferably charges the battery to the battery charge amount required to start the internal combustion engine.

Thus, the starting characteristic of the internal combustion engine can be secured. Further, because the start charge amount for battery recharging by the power generator when the ignition switch has been turned ON can be reduced, the control voltage range of charge and discharge control can be further increased.

The power supply device of the present invention preferably comprises travel route information acquiring means that acquires information related to a vehicle travel route, wherein the controlling means preferably predicts the travel state of the vehicle on the basis of travel route information acquired by the travel route information acquiring means and controls the thermoelectric converter by considering the predicted travel state.

In this case, on the basis of travel route information such as the number of intersections, gradient of the road, curvature of the road and existence of congestion, and so forth, for example, the travel state of the vehicle in the case of traveling along a planned travel route is predicted. As a result, the battery charge amount, heat accumulation amount, and so forth, can be efficiently managed on the basis of the travel state of the vehicle.

Further, the travel route information acquiring means is a car navigation system that guides the vehicle to a place of destination; and the controlling means preferably predicts the required amount of accumulated heat of the heat accumulator from the place of destination and the current position and controls the thermoelectric converter in accordance with the required amount of accumulated heat.

In this case, the accumulated heat amount required to reach a place of destination is predicted from the positional relationship between the place of destination and the current position. Therefore, the accumulated heat amount of the heat accumulator and the predicted required amount of accumulated heat are compared and the surplus accumulated heat amount can be distributed to the power supply to the battery. As a result, power can be supplied to the battery from the thermoelectric converter by effectively using the heat amount that has accumulated in the heat accumulator while securing the required amount of accumulated heat.

The power supply device of the present invention, further comprising environment information acquiring means that acquires information relating to a vehicle environment, wherein the controlling means preferably predicts the heat amount required by the vehicle on the basis of the vehicle environment acquired by the environment information acquiring means and controls the thermoelectric converter by further considering the required heat amount. Here, the environment information acquiring means is an air conditioner electronic control device that controls the air conditioning of the vehicle interior and the air conditioner electronic control device preferably acquires an outside air temperature, vehicle interior temperature and air conditioner set temperature.

In this case, the heat amount required by the vehicle is predicted on the basis of the vehicle environment information such as the temperature in the vehicle, humidity in the vehicle, outside-air temperature, and air-conditioner set temperature, for example. The accumulated heat amount of the heat accumulator and the predicted required heat amount are compared and the surplus accumulated heat amount can be distributed to the power supply to the battery. As a result, power can be supplied to the battery from the thermoelectric converter by effectively using the heat mount that has accumulated in the heat accumulator while securing the heat amount required by the vehicle.

DESCRIPTION OF THE PREFERRED EMBODIMENTS

Figure 1:
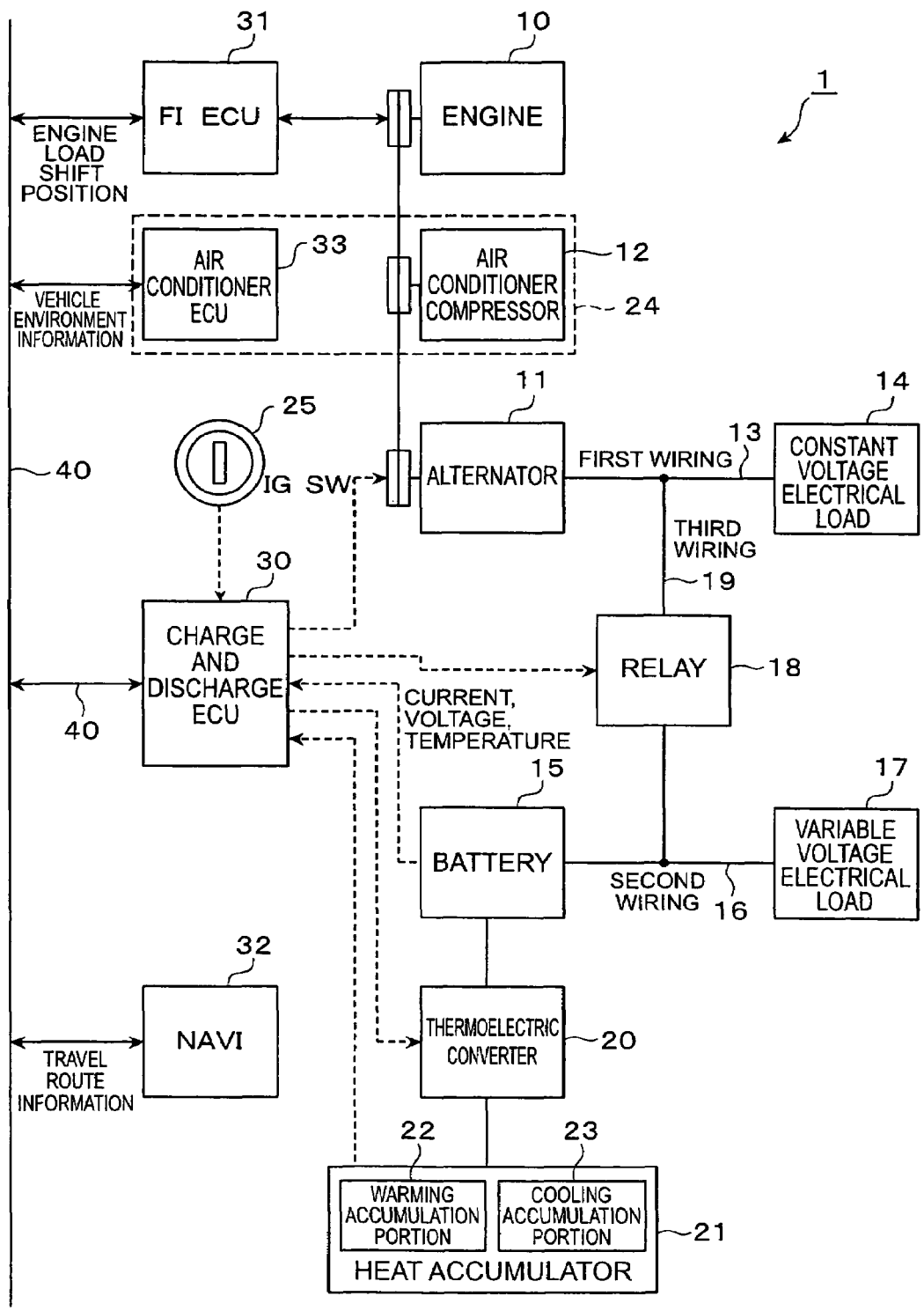
FIG. 1 is a block diagram showing the overall constitution of the power supply device according to an embodiment.

Preferred embodiments of the present invention will be described hereinbelow with reference to the drawings. The same reference symbols have been used for parts that are the same or equivalent in the drawings.

First, the constitution of a power supply device 1 according to this embodiment will be described by using FIG. 1. FIG. 1 is a block diagram showing the overall constitution of the power supply device 1 mounted in a vehicle.

The drive force driving the vehicle is generated by an engine 10 constituting an internal combustion engine. The engine 10 itself is a general engine that is publicly known. The output of the engine 10 is transmitted to the drive wheels via the transmission or differential gear and so forth to drive the vehicle. Further, an alternator (power generator) 11 and an air conditioner compressor 12, which are driven by using a portion of the output of the engine 10, are provided attached to the engine 10.

The alternator 11 contains a rectifier that rectifies an AC current generated by an AC power generator to produce a DC current and an IC regulator that regulates the output voltage, and the alternator 11 outputs DC power. The alternator 11 is connected to a charge and discharge control electronic control device (hereinafter called the 'charge and discharge ECU') 30 and the generated power is variably controlled through regulation of the excitation current.

A constant voltage electrical load 14, which is driven by a constant voltage of 12 V or the like, for example, is connected via first wiring 13 to the alternator 11. The constant voltage electrical load 14 is expressed as a variation of a function permitting the effects of removing a predetermined voltage to be perceived by the driver and therefore corresponds to a light that varies in brightness when the predetermined voltage is removed or a wiper whose drive speed changes, and so forth.

On the other hand, a variable voltage electrical load 17 that is driven in a predetermined voltage range is connected via the second wiring 16 to a battery 15 that is mounted in the vehicle. As the variable voltage electrical load 17, a variety of electronic control devices (ECU) and sensors, for example, may be cited. These loads are designed to guarantee operation at 5V to 16V and 8V to 16V respectively, for example. Hence, even when there is a change in voltage, these loads do not produce a functional variation. Further, a current sensor that detects a charge and discharge current of the battery 15, a voltage sensor that detects the battery voltage, and a temperature sensor that detects the battery temperature, are attached to the battery 15. The current sensor, voltage sensor and temperature sensor are connected to the charge and discharge ECU 30 and the detected signals are outputted to the charge and discharge ECU 30.

The first wiring 13 and second wiring 16 are connected by third wiring 19 via a relay 18 that interrupts the wiring. The relay 18 is connected to the charge and discharge ECU 30 and driven by the control signal of the charge and discharge ECU30. The first wiring 13 and second wiring 16 are interrupted as a result of the relay 18 turning ON and OFF. That is, the relay 18 functions as interrupting means.

When the relay 18 is turned OFF, the connection between the first wiring 13 and second wiring 16 is broken. Here, the power generated by the alternator 11 is supplied to the constant voltage electrical load 14 via the first wiring 13 and the power outputted from the battery 15 is supplied to the variable voltage electrical load 17 via the second wiring 16. On the other hand, when the relay 18 is turned ON, the first wiring and second wiring are connected via the third wiring and the relay 18. Thereupon, the power generated by the alternator 11 is supplied to the variable voltage electrical load 17 and battery 15, and the battery 15 is charged.

Further, a thermoelectric converter 20 that converts thermal energy to DC electrical energy by using a thermoelectric element is connected to the battery 15. The power generated by the thermoelectric converter 20 is supplied to the battery 15 and the battery 15 is charged. The thermoelectric converter 20 is constituted comprising a plurality of thermoelectric elements, wherein warming heat is supplied from a warming accumulation portion 22 of a heat accumulator 21 to one terminal of the thermoelectric elements and cooling heat is supplied from a cooling accumulation portion 23 of the heat accumulator 21 to the other terminal. Because one terminal of the thermoelectric elements is heated and the other terminal is cooled, a temperature difference is produced across the terminals of the thermoelectric elements and an electromotive force is produced as a result of the Seebeck effect in accordance with this temperature difference. The power generation amount of the thermoelectric converter 20 is regulated by the charge and discharge ECU 30.

The heat accumulator 21 is constituted comprising the warming accumulation portion 22 that accumulates warming heat and a cooling accumulation portion 23 that accumulates cooling heat. Cooling water of the engine 10 is recycled to the warming accumulation portion 22 and warming heat is accumulated as a result of heating the warmth accumulation material in the warming accumulation portion 22 by means of the heat of the engine cooling water. On the other hand, a cooling medium that is compressed by an air conditioner compressor 12 and liquefied by means of a condenser is vaporized in the cooling accumulation portion 23 and cooling heat is accumulated by cooling the cooling accumulation material in the cooling accumulation portion 23 by means of the vaporized heat when vaporization is performed. A temperature sensor is attached to each of the warming accumulation portion 22 and cooling accumulation portion 23 of the heat accumulator 21. The temperature sensors are connected to the charge and discharge ECU 30 and the detected signals are outputted to the charge and discharge ECU 30. As described earlier, the warming heat and cooling heat that is accumulated in the heat accumulator 21 is supplied to the thermoelectric converter 20. Further, the warming heat and cooling heat that is accumulated in the heat accumulator 21 is used in the air-conditioning of the vehicle interior by the air conditioner 24.

As mentioned earlier, the charge and discharge ECU 30 drives the relay 18 in accordance with the operating state of the engine 10, the heat accumulation state of the heat accumulator 21 and the state of charge (SOC) of the battery 15 and the thermoelectric converter 20 is controlled in accordance with the state of charge of the battery 15 and the heat accumulation state of the heat accumulator 21. That is, the charge and discharge ECU 30 functions as controlling means. Further, an ignition switch 25 is also connected to the charge and discharge ECU 30 and the power supply state of the vehicle is monitored by the charge and discharge ECU 30.

An air conditioner electronic control device ('air conditioner ECU' hereinbelow) 33 controls the air conditioning of the vehicle interior by variably controlling the cooling medium discharge amount (compressor capacity) of the air conditioner compressor 12, and so forth. An outside air temperature sensor that detects the temperature outside the vehicle, a vehicle interior temperature sensor that detects the temperature of the vehicle interior, and an operating panel are connected to the air conditioner ECU 33. The set temperature, airflow mode, air flow amount, and so forth are set by means of the operating panel. That is, the air conditioner ECU 33 functions as environment information acquiring means for acquiring vehicle environment information such as the outside air temperature, vehicle interior temperature, and the set temperature.

An engine control electronic control device (called the 'FI ECU' hereinbelow) 31 integrally controls the operation of the engine 10 by regulating the inhaled air amount, fuel injection amount and ignition cycle and so forth in accordance with the operating state of the engine 10.

Each of the charge and discharge ECU 30, FI ECU 31, and air conditioner ECU 33 are constituted comprising a microprocessor for performing computations, a ROM for storing a program or the like in order to allow the microprocessor to execute processes, and a backup RAM for saving the stored content by means of RAM for storing various data such as computation results and the battery 15, and so forth.

The charge and discharge ECU 30, FI ECU 31, and air conditioner ECU 33 are connected by a communication line 40 such as a CAN (Controller Area Network), for example, and constituted to enable the mutual exchange of data. Information such as the engine load and shift position of the transmission is transmitted from the FI ECU 31 to the charge and discharge ECU 30 via the communication line 40. Further, vehicle environment information such as the outside air temperature and vehicle interior temperature is transmitted from the air conditioner ECU 33 to the charge and discharge ECU 30.

The charge and discharge ECU 30 is also connected via the communication line 40 to a car navigation system 32 that guides the vehicle to the place of destination. The car navigation system 32 contains a storage medium such as a hard disk or DVD disk for storing road and topographical information such as the disposition of intersections, road gradients and road curvature, as well as other information (facility information, for example). Further, the car navigation system 32 comprises a communication function and is also able to acquire meteorological (weather) information and congestion information and so forth from outside the vehicle. The car navigation system 32 may also acquire the abovementioned road and topological information and so forth by means of the communication function.

When the place of destination has been set, the car navigation system 32 acquires the recommended route, as well as travel route information such as the disposition of intersections, road gradients, road curvature, and congestion information over all sections of the route. That is, the car navigation system 32 functions as travel route information acquiring means that acquires travel route information. Further, the vehicle's own position is detected by using a GPS or gyro or the like. The car navigation system 32 transmits the acquired travel route information and the vehicle's own position to the charge and discharge ECU 30 via the communication line 40.

Figure 2:
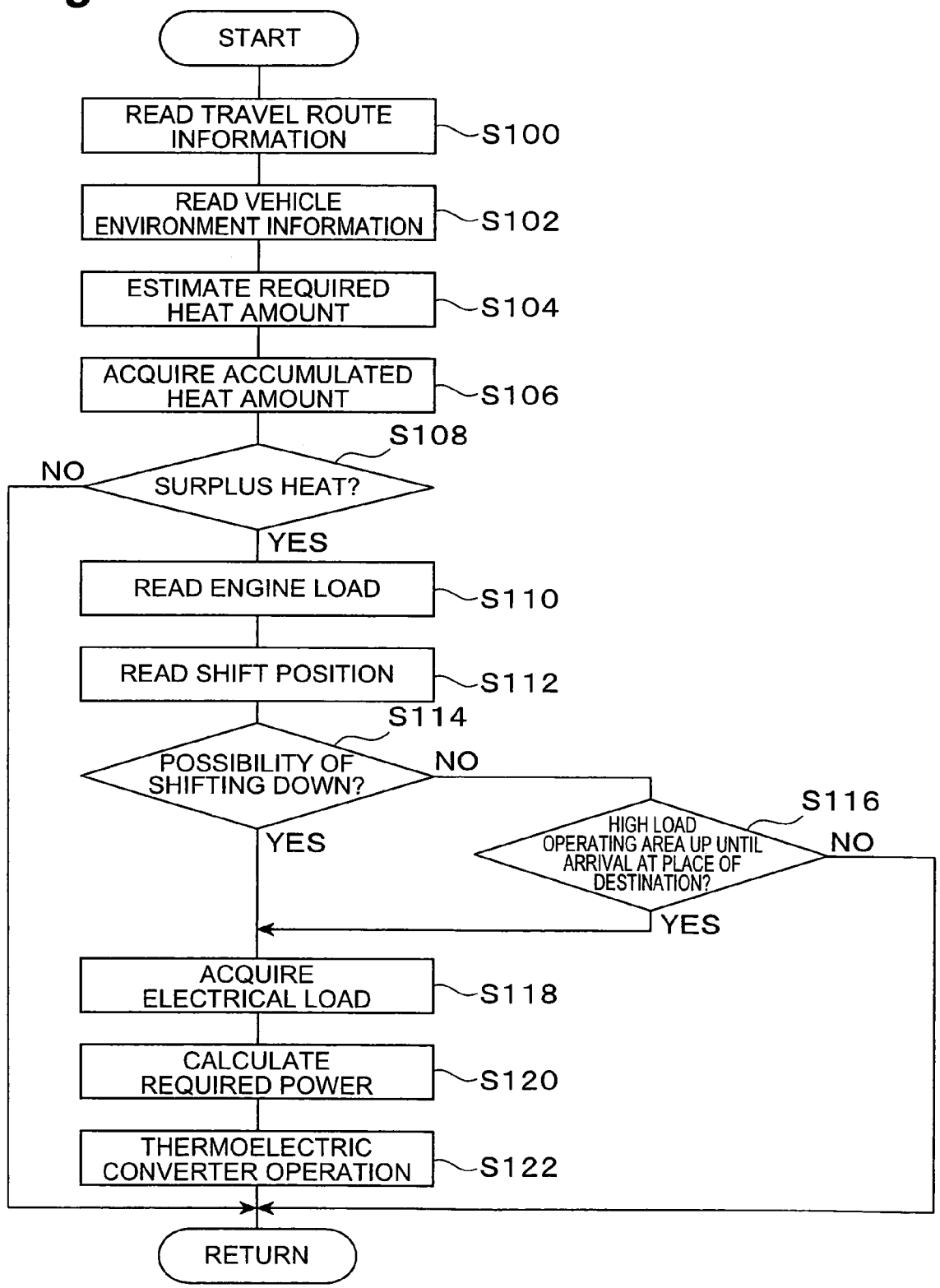
FIG. 2 is a flowchart showing a processing procedure for thermoelectric converter control by the power supply device.

The operation of the power supply device 1 will be described next with reference to FIGS. 2 to 5. First, the thermoelectric converter control by the power supply device 1 will be described with reference to FIG. 2. FIG. 2 is a flowchart showing a processing procedure for thermoelectric converter control by the power supply device 1. This processing is performed by the charge and discharge ECU 30 and executed repeatedly with predetermined timing from the time when the power supply of the vehicle is turned ON to the time the power supply is turned OFF.

In step S100, the place of destination, the current position (vehicle's own position) and travel route information such as the disposition of the intersections relating to the set travel route, route gradients, route curvature, and congestion information are read from the car navigation system 32. In step S102 that follows, vehicle environment information such as the outside air temperature, the vehicle interior temperature and the set temperature of the air conditioner 24, and so forth are read from the air conditioner ECU 33.

Thereafter, in step S104, the heat amount required until arrival at the place of destination is estimated on the basis of the travel route information and vehicle environment information read in steps S100 and S102 respectively. Here, the heat amount required to charge the battery 15 to the battery charge amount required to restart the engine 10 is also considered. Meanwhile, in step S106, the heat amount accumulated in the heat accumulator 21 is determined on the basis of the respective temperature and volume and so forth of the cooling accumulation material and warmth accumulation material.

In subsequent step S108, the required heat amount estimated in step S104 and the accumulated heat amount determined in step S106 are compared and a judgment of whether there is a surplus heat amount is performed. Here, when the required heat amount is larger than the accumulated heat amount, that is, when there is no surplus heat amount, the processing temporarily exits this process. On the other hand, when the accumulated heat amount is larger than the required heat amount, that is, when a surplus heat amount has accumulated, the processing moves to step S110.

In step S110, an engine load is read from the FI ECU31. Further, in the subsequent step S112, the shift position of the transmission is read from the FI ECU 31.

Thereafter, in step S114, a judgment of whether there is a possibility of shifting down a gear is made on the basis of travel route information such as the road gradient read in step S100 and information such as the engine load, shift position, and so forth read in steps S110 and S112. Here, when it is judged that there is a possibility of shifting down a gear, the processing moves to step S118. On the other hand, when it is judged that there is no possibility of shifting down, processing moves to step S116.

In step S116, a judgment of whether a high load operating area exists up until arrival at the place of destination is made on the basis of travel route information such as road gradients, road curvature, and congestion information and information such as engine specifications. Here, when it is judged that there is a high load operating area, the processing moves to step S118. On the other hand, when it is judged that there is no high load operating area, the processing temporarily exits this process.

In step S118, the electrical load amounts of the constant voltage electrical load 14 and variable voltage electrical load 17 are determined from the power generation amount (or voltage value or current value of the first wiring 13) of the alternator 11, the charge and discharge amount of the battery 15 and power generation amount of the thermoelectric converter (or voltage value or current value of the second wiring 16) and so forth. In the subsequent step S120, the required power amount is calculated in accordance with the electrical load amount determined in step S118.

Thereafter, in step S122, cooling heat and warming heat are supplied from the heat accumulator 21 to the thermoelectric converter 20 and power generation is performed by the thermoelectric converter 20 in accordance with the required power amount determined in step S120.

Figure 3:
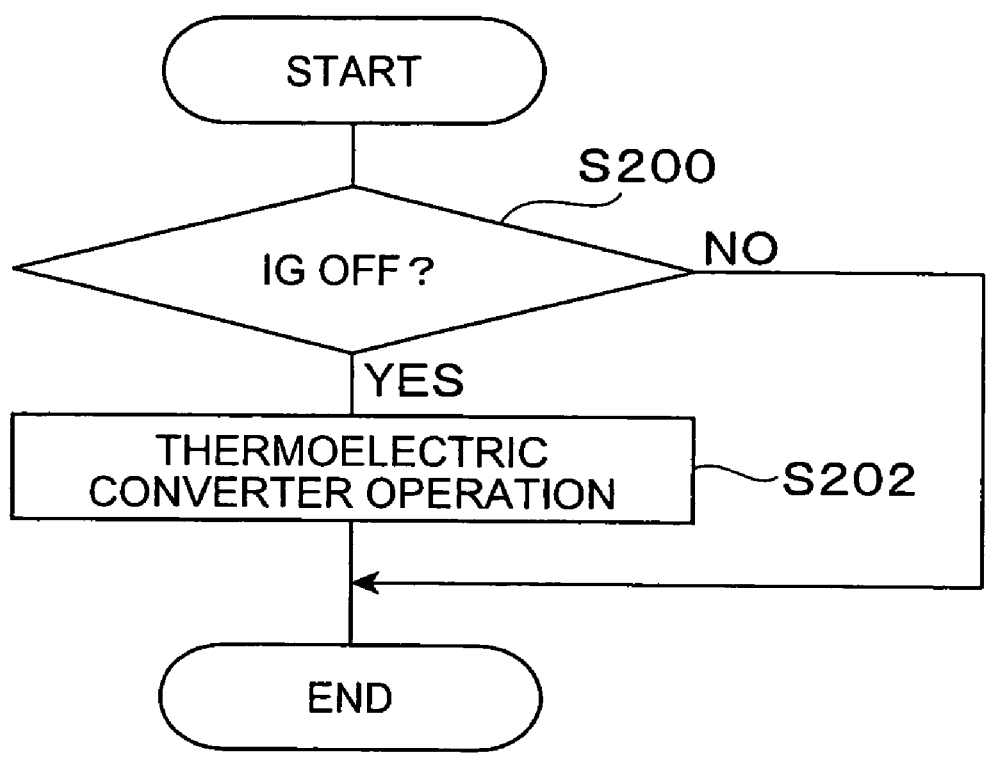
FIG. 3 is a flowchart showing a processing procedure for thermoelectric converter control when the ignition is off.

Thermoelectric converter control when the ignition switch is off will be described next with reference to FIG. 3. FIG. 3 is a flowchart showing a processing procedure for thermoelectric converter control when the ignition is off. This processing is performed by the charge and discharge ECU 30 and is executed after the power supply of the vehicle has been turned off.

In step S200, a judgment of whether the ignition switch 25 has been turned off is performed. Here, the processing moves to step S202 when the ignition switch 25 has been turned off. On the other hand, when the ignition switch 25 has not been turned off, the processing temporarily exits this process and the abovementioned thermoelectric converter control is executed.

In step S202, the thermoelectric converter 20 is driven, the heat amount that has accumulated in the heat accumulator 21 is all converted to power, and the battery 15 is charged. As a result, the restart characteristic of the engine 10 is secured.

Figure 4:
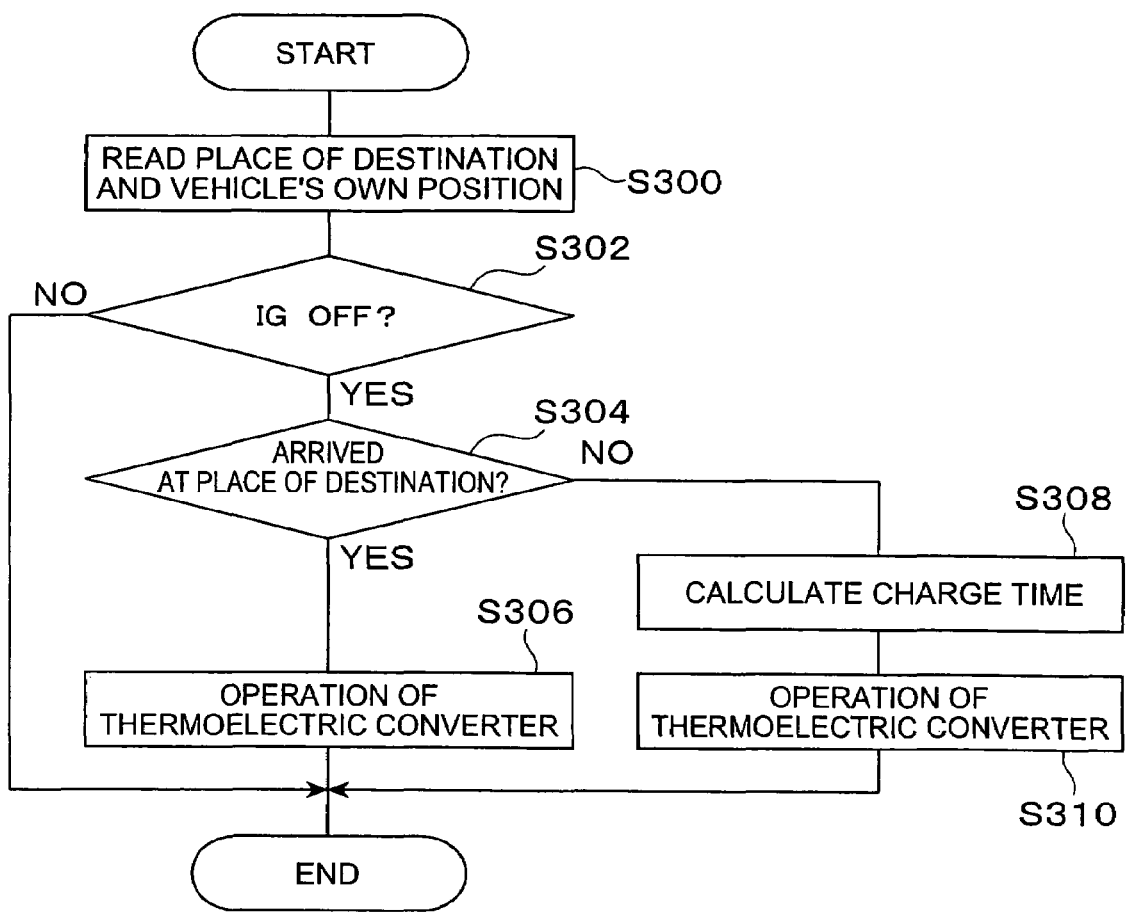
FIG. 4 is a flowchart showing a processing procedure for thermoelectric converter control when the ignition is off.

Further thermoelectric converter control when the ignition switch has been turned off will be described next with reference to FIG. 4. FIG. 4 is a flowchart showing another processing procedure for thermoelectric converter control when the ignition is off. This processing is also performed by the charge and discharge ECU 30 and executed after the power supply of the vehicle has been turned off.

In step S300, the place of destination and current position (vehicle's own position) is read from the car navigation system 32. In the subsequent step S302, a judgment of whether the ignition switch 25 has been turned off is performed. Here, when the ignition switch 25 has been turned off, the processing moves to step S304. On the other hand, when the ignition switch 25 has not been turned off, the processing temporarily exits this process and the abovementioned thermoelectric converter control is executed.

In step S304, the place of destination and the current position read in step S300 are compared and a judgment of whether the vehicle has arrived at the place of destination is performed. Here, when it is judged that the vehicle has arrived at the place of destination, the processing moves to step S306. On the other hand, when it is judged that the vehicle has not yet arrived at the place of destination, the processing moves to step S308.

In step S306, the thermoelectric converter 20 is driven and the battery 15 is charged. In this case, because the vehicle has already arrived at the place of destination, the battery 15 is charged as a result of the heat amount that has accumulated in the heat accumulator 21 all being converted to power. Thereafter, this processing is terminated.

In step S308, the charge time of the battery 15 is determined on the basis of the battery charge amount required to restart engine 10. Thereafter, in the subsequent step S310, the cooling heat and warming heat are supplied from the heat accumulator 21 to the thermoelectric converter 20 and power generation is performed by the thermoelectric converter 20 until the determined charge time has elapsed. The battery 15 is then charged to the charging amount that enables a restart. This processing is then terminated.

Figure 5:
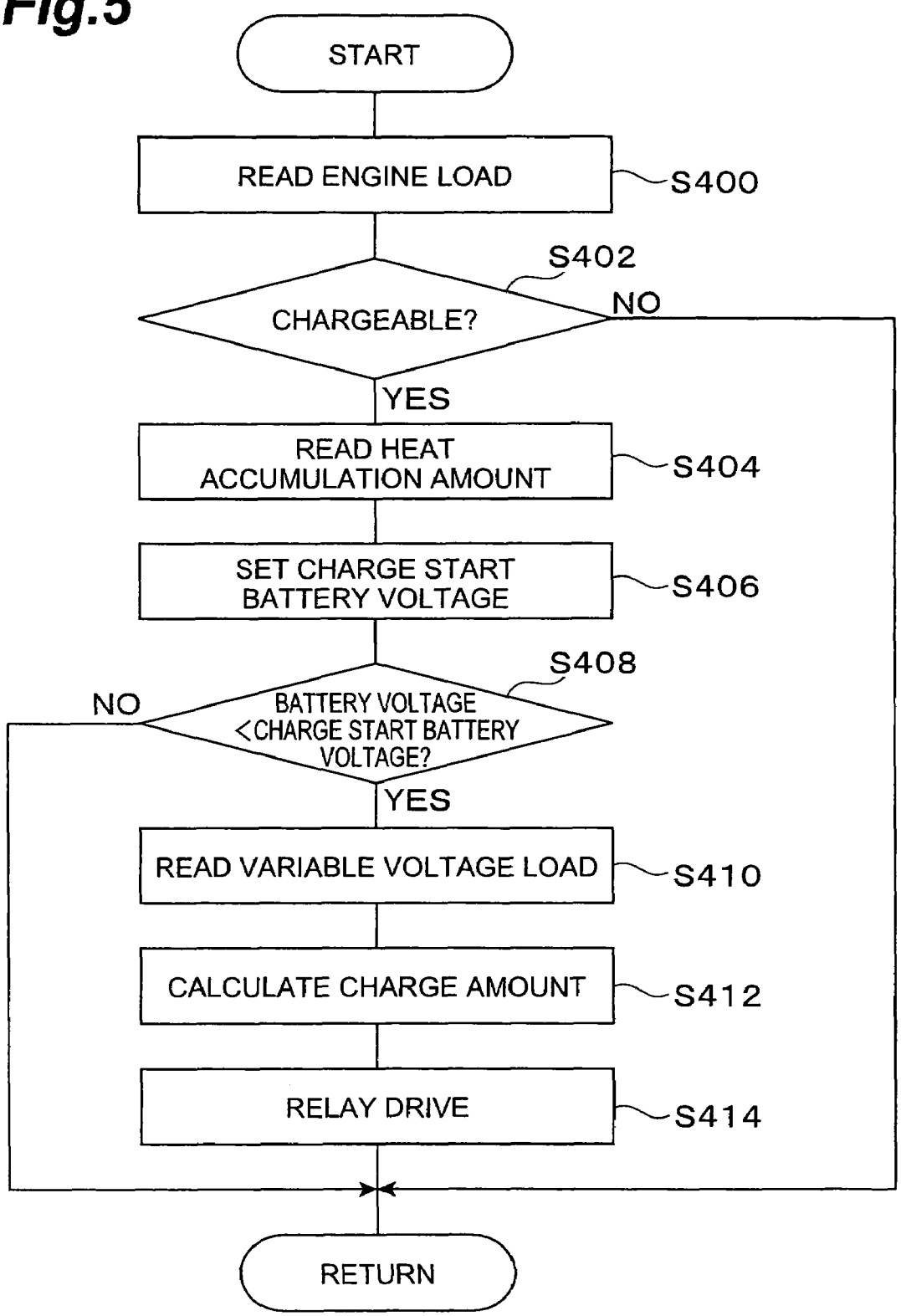
FIG. 5 is a flowchart showing a processing procedure for charge control by the power supply device.

The charging control by the power supply device 1 will be described next with reference to FIG. 5. FIG. 5 is a flowchart showing the processing procedure for charging control by the power supply device 1. This processing is performed by the charge and discharge ECU 30 and executed repeatedly with predetermined timing from the time the power supply of the vehicle has been turned on until the power supply has been turned off.

In step S400, the engine operating state such as the engine load is read from the FI ECU 31. Thereafter, in step S402, a judgment of whether the operating state is an operating state permitting charging without a deterioration of drivability on the basis of the engine load read in step S400 is made. Here, when it is judged that the operating state is an operating state permitting charging without a deterioration of drivability, the processing moves to step S404. On the other hand, when it is judged that the operating state is an operating state that does not permit charging with a deterioration of drivability, the processing temporarily exits this process.

In step S404, the heat amount that has accumulated in the heat accumulator 21 is determined on the basis of the temperature and volume and so forth of the cooling accumulation material and warmth accumulation material.

In the subsequent step S406, the charge start battery voltage (or battery charge amount) of the alternator 11 is set on the basis of the accumulated heat amount that has accumulated in the heat accumulator 21 determined in step S404 and the temperature difference between the temperature of the warming accumulation portion 22 and the temperature of the cooling accumulation portion 23. More specifically, a map (charge start battery voltage map) in which the relationship between the heat amount that has accumulated in the heat accumulator 21, the temperature difference between the temperature of the warming accumulation portion 22 and cooling accumulation portion 23, and the charge start battery voltage is stored in the ROM of the charge and discharge ECU 30. Further, the charge start battery voltage map is searched by means of the accumulated heat amount and temperature difference and the charge start battery voltage is determined.

Figure 6:
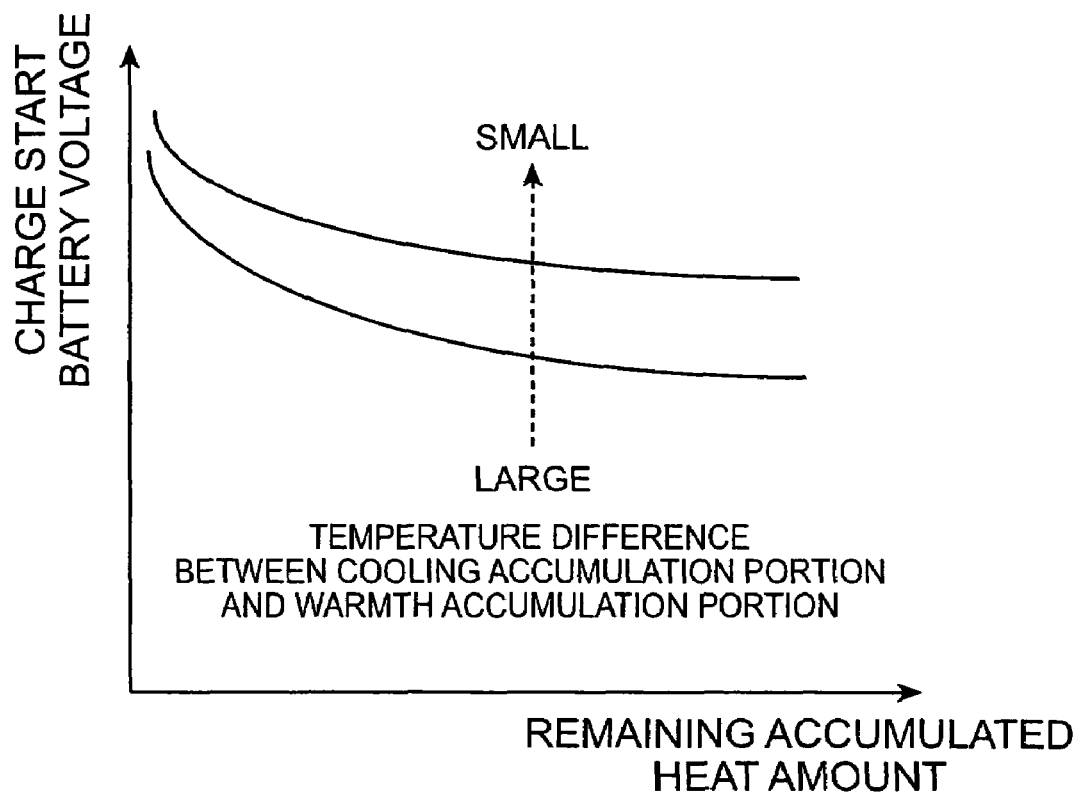
FIG. 6 shows an example of a charge start battery voltage map.
Figure 8:
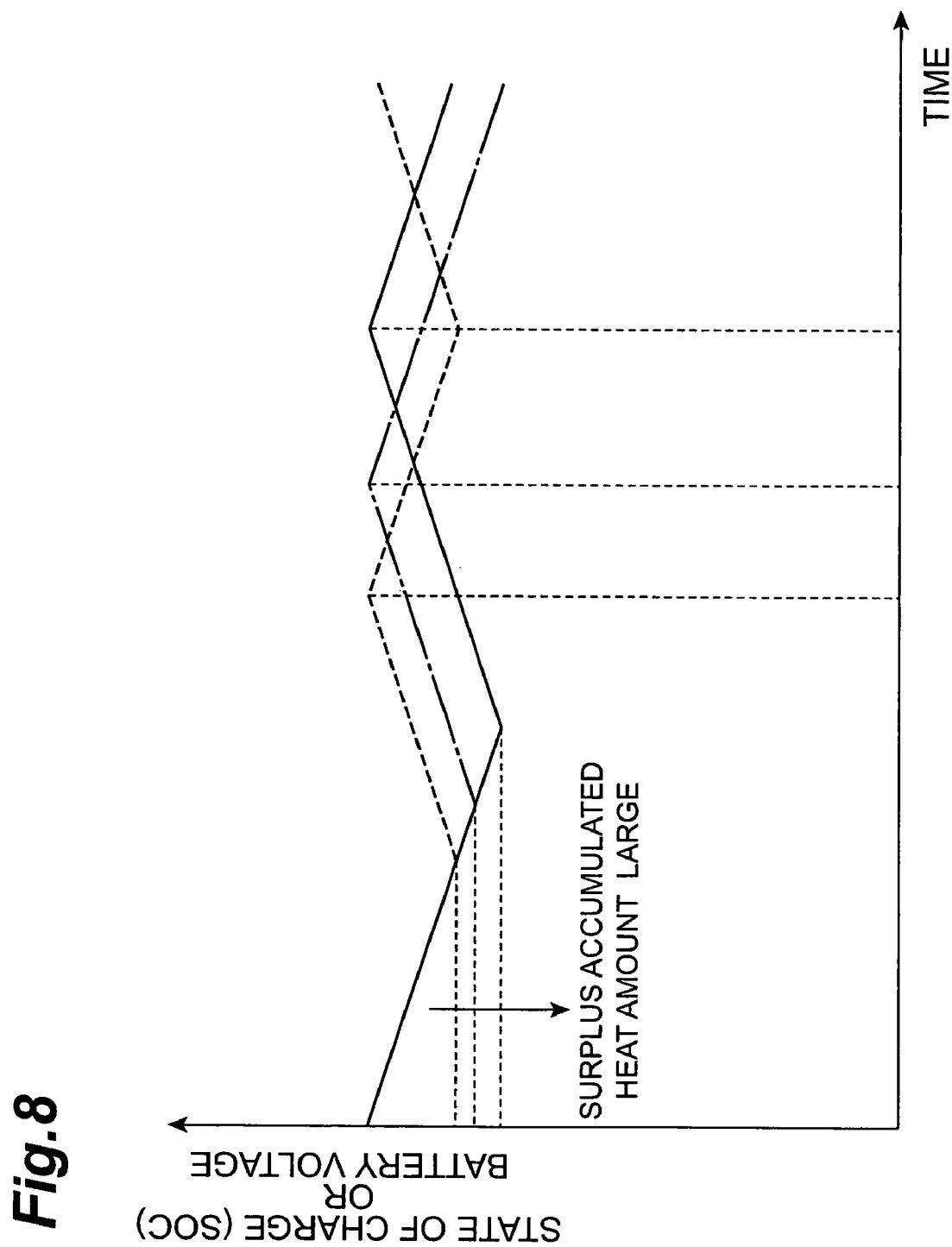
FIG. 8 shows a change in the state of charge of a battery that is undergoing charge and discharge control.

As shown in FIG. 6, the charge start battery voltage map is established so that the charge start battery voltage drops as the accumulated heat amount of the heat accumulator 21 increases. Further, the charge start battery voltage map is established so that the charge start battery voltage drops in step with increases in the temperature difference between the temperature of the warming accumulation portion 22 and the temperature of the cooling accumulation portion 23. As a result, as shown in FIG. 8, the control voltage range of the charge and discharge control is extended and the control cycle grows longer as the accumulated heat amount of the heat accumulator 21 increases.

Thereafter, in step S408, a judgment of whether the voltage of the battery 15 is lower than the charge start battery voltage set in step S406 is performed. Here, when the voltage of the battery 15 is lower than the charge start battery voltage, the processing moves to step S410. On the other hand, when the voltage of the battery 15 is equal to or more than the charge start battery voltage, the processing temporarily exits this processing.

In step S410, the electrical load amount of the variable voltage electrical load 17 is determined from the charge and discharge amount of the battery 15 and the power generation amount (or voltage value and current value of the second wiring 16) of the thermoelectric converter.

Thereafter, in step S412, the target charge amount of the battery 15 is set on the basis of the electrical load amount of the variable voltage electrical load 17 determined in step S410 and the engine load. More specifically, a map (target charge amount map) that establishes the relationship between the electrical load amount of the variable voltage electrical load 17, the engine load, and the target charge amount of the battery 15 is stored in the ROM of the charge and discharge ECU 30. Further, the target charge amount is searched by means of the electrical load amount and the engine load and the target charge amount is determined.

Figure 7:
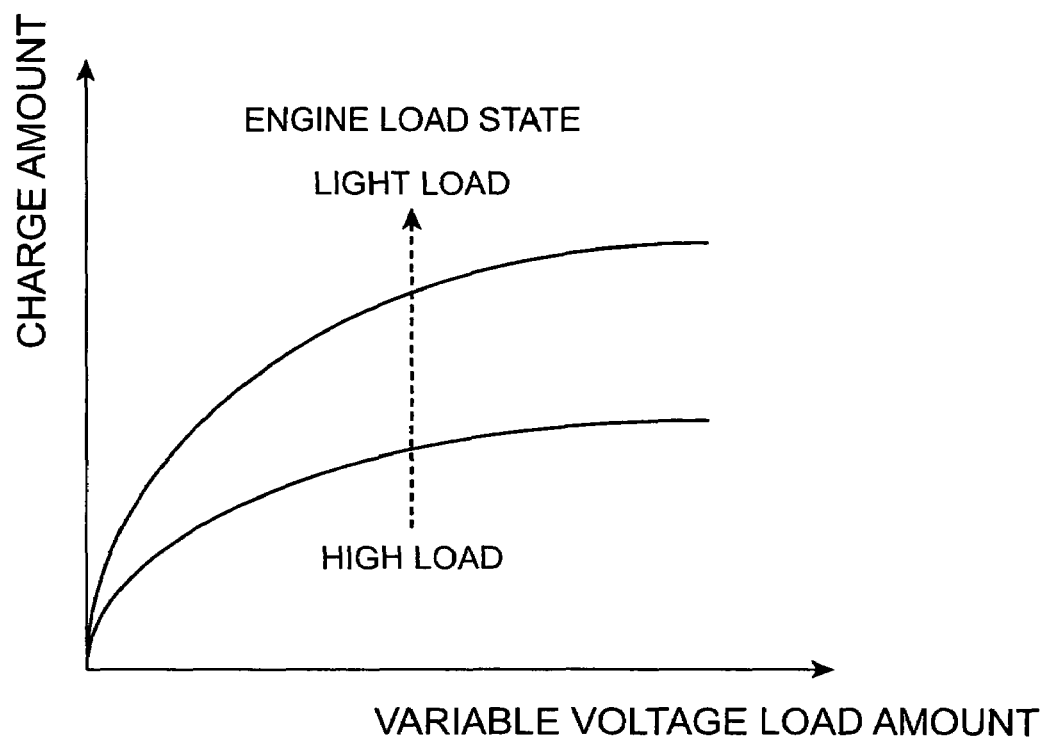
FIG. 7 shows an example of a target charge amount map.

As shown in FIG. 7, the target charge amount map is established such that the target charge amount increases as the electrical load amount of the variable voltage electrical load 17 increases. Further, the target charge amount map is established such that the target charge amount increases as the engine load grows lighter.

In the subsequent step S414, the relay 18 is turned ON in accordance with the target charge amount of the battery 15 that was established in step S412. As a result, the power generated by the alternator 11 is supplied to the battery 15 via the relay 18 and the battery 15 is charged.

Thus, according to the power supply device 1, the electrical load on the vehicle is divided into the constant voltage electrical load 14 that is driven at 12V and the variable voltage electrical load 17 that is driven at 5V to 16V, for example. The alternator 11 and constant voltage electrical load 14 are connected by means of the first wiring 13, the battery 15 and variable voltage electrical load 17 are connected by means of the second wiring 16, and the first wiring 13 and second wiring 16 are connected via the relay 18. The relay 18 is controlled on the basis of the operating state of the engine 10, the heat accumulation state of the heat accumulator 21 and the state of charge of the battery 15. When the first wiring 13 and second wiring 16 are interrupted, the power that is outputted from the alternator 11 is supplied to only the constant voltage electrical load 14. Hence, the electrical load connected to the alternator 11 is lightened and the drive load fluctuations of the alternator 11 decrease.

For example, a situation where, in traveling on a highway, the heat amount generated by the engine 10 increases and the heat amount that is accumulated in the heat accumulator 21 increases, may be considered. In such a situation, the thermoelectric converter 20 produces a voltage of 12V or more and this power can be supplied to the variable voltage electrical load 17. In such a situation, the power of the alternator 11 is also supplied to only the constant voltage electrical load 14 and, therefore, the drive load fluctuations of the alternator 11 decrease.

On the other hand, when charging is performed from the alternator 11 to the battery 15, the first wiring 13 and second wiring 16 are connected and the power that is outputted from the alternator 11 is supplied to the battery 15 and variable voltage electrical load 17. Here, the drive judgment of the relay 18 is made in accordance with the operating state and so forth of the engine 10 that drives the alternator 11. Therefore, charging in an operating area such that the drivability is made to deteriorate can be prevented. In addition, according to the power supply device 1, the variable voltage electrical load 17, to which power is supplied from the battery 15, can be driven by means of a low voltage of 12V or less, for example, and the battery 15 is also able to receive a supply of power from the thermoelectric converter 20. Therefore, the control voltage range of the charge and discharge control is extended and the control freedom of the relay 18 can be increased. As a result, load fluctuations of the engine 10 are suppressed and, therefore, a deterioration in drivability can be suppressed and fuel consumption can be improved.

According to the power supply device 1, the heat amount required up until arrival at the place of destination is predicted on the basis of the positional relationship between the place of destination and the current position, travel route information such as road gradients and the existence of congestion, and vehicle environment information such as the vehicle interior temperature and air conditioner set temperature. Further, the thermoelectric converter 20 is controlled by considering the heat amount required in order to charge the battery 15 to the battery charge amount that allows the engine 10 to start, in addition to the estimated required heat amount. As a result, power can be supplied from the thermoelectric converter 20 to the battery 15 by efficiently using the heat amount that has accumulated in the heat accumulator 21 while securing the required heat amount.

Further, according to the power supply device 1, after the ignition switch 25 has been turned off, the battery 15 is charged by using the remaining heat amount of the heat accumulator 21. Therefore, the restart characteristic of the engine 10 can be secured. Meanwhile, because the charge start voltage of the battery 15 when the engine is running can be reduced in accordance with the remaining heat amount, the control voltage range of the charge and discharge control can be expanded further.

An embodiment of the present invention was described hereinabove. However, the present invention is not limited to or by the above embodiment and a variety of modifications of the present invention are possible. For example, in the above embodiment, a relay was used to interrupt the first wiring 13 and second wiring 16 but a switching element such as a power MOS FET may be used instead of the relay.

Furthermore, the air conditioner compressor 12 may be constituted driven (regenerated) by means of a motive force from the vehicle wheels in addition to the drive force from the engine 10. Accordingly, fuel consumption can be improved still further by recovering the braking energy by means of the air conditioner compressor 12.

Further, in the above embodiment, warming heat is accumulated by heating the warmth accumulation material in the warming accumulation portion 22 by means of the heat of the engine cooling water. However, the constitution may be such that the exhaust heat of the engine 10 or other exhaust heat is accumulated instead of the engine cooling water or in addition to the engine cooling water.

In addition, the constitution of each ECU, function-sharing, and a connection state that employs the communication line 40 and so forth are not limited to those of the above embodiment.

As described in detail hereinabove, according to the present invention, by rendering a constitution comprising a thermoelectric converter that divides the electrical load mounted in the vehicle into a constant voltage electrical load to which the power outputted by the power generator is supplied and a variable voltage electrical load to which the power outputted by the battery is supplied, and which supplies the power generated by using the heat that has accumulated in the heat accumulator to the battery, a deterioration in drivability is suppressed and fuel consumption can be improved.

What is claimed is:

1. A power supply device, comprising:
    first wiring that connects a power generator that is driven by an internal combustion engine and a constant voltage electrical load that is driven at a predetermined voltage;
    a heat accumulator that accumulates cooling heat and warming heat;
    a thermoelectric converter that generates power by using the heat accumulated in the heat accumulator and which supplies the generated power to the battery;
    second wiring that connects the battery and a variable voltage electrical load that is driven in a predetermined voltage range;
    interrupting means provided on third wiring that connects the first wiring and the second wiring, which interrupts the first wiring and the second wiring; and
    controlling means that controls the thermoelectric converter and also controls the interrupting means on the basis of the operating state of the internal combustion engine, the heat accumulation state of the heat accumulator, and the state of charge of the battery.

2. The power supply device according to claim 1, wherein the controlling means controls the thermoelectric converter in accordance with the heat amount that has accumulated in the heat accumulator and the battery charge amount required to start the internal combustion engine.

3. The power supply device according to claim 2, wherein the controlling means allows the thermoelectric converter to operate when an ignition switch of a vehicle is turned off and charges the battery to the battery charge amount required to start the internal combustion engine.

4. The power supply device according to claim 1, further comprising:
    travel route information acquiring means that acquires information related to a vehicle travel route,
    wherein the controlling means predicts the travel state of the vehicle on the basis of travel route information acquired by the travel route information acquiring means and controls the thermoelectric converter by considering the predicted travel state.

5. The power supply device according to claim 4, wherein the travel route information acquiring means is a car navigation system that guides the vehicle to a place of destination; and
    the controlling means predicts the required amount of accumulated heat of the heat accumulator from the place of destination and the current position and controls the thermoelectric converter by further considering the required amount of accumulated heat.

6. The power supply device according to claim 4, further comprising:
    environment information acquiring means that acquires information relating to a vehicle environment,
    wherein the controlling means predicts the heat amount required by the vehicle on the basis of the vehicle environment information acquired by the environment information acquiring means and controls the thermoelectric converter by further considering the required heat amount.

7. The power supply device according to claim 6, wherein the environment information acquiring means is an air conditioner electronic control device that controls the air conditioning of the vehicle interior and the air conditioner electronic control device acquires an outside air temperature, vehicle interior temperature and air conditioner set temperature.

* * * * *